United States Patent
Wang et al.

(10) Patent No.: US 12,396,157 B2
(45) Date of Patent: Aug. 19, 2025

(54) PREPARATION METHOD FOR SEMICONDUCTOR STRUCTURE, SEMICONDUCTOR STRUCTURE AND SEMICONDUCTOR MEMORY

(71) Applicant: CHANGXIN MEMORY TECHNOLOGIES, INC., Hefei (CN)

(72) Inventors: Xiaoling Wang, Hefei (CN); Hai-Han Hung, Hefei (CN); Min-Hui Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 629 days.

(21) Appl. No.: 17/650,380

(22) Filed: Feb. 8, 2022

(65) Prior Publication Data
US 2023/0028597 A1    Jan. 26, 2023

Related U.S. Application Data

(63) Continuation of application No. PCT/CN2021/110764, filed on Aug. 5, 2021.

(30) Foreign Application Priority Data

Jul. 20, 2021    (CN) .................. 202110821150.9

(51) Int. Cl.
H10B 12/00    (2023.01)
H01L 21/762    (2006.01)
H10D 62/10    (2025.01)

(52) U.S. Cl.
CPC ............ *H10B 12/31* (2023.02); *H01L 21/762* (2013.01); *H10B 12/482* (2023.02); *H10B 12/488* (2023.02); *H10D 62/115* (2025.01)

(58) Field of Classification Search
CPC .................. H10B 12/482; H10B 12/488; H10B 12/0335; H10B 12/05; H10B 12/31;
(Continued)

(56) References Cited

U.S. PATENT DOCUMENTS 5,929,477 A    7/1999    Burns, Jr.
9,142,558 B2    9/2015    Yang et al.
(Continued)

FOREIGN PATENT DOCUMENTS

| | | |
|---|---|---|
| CN | 103840002 A | 6/2014 |
| CN | 108183097 A | 6/2018 |
| CN | 108231775 A | 6/2018 |

*Primary Examiner* — Julio J Maldonado
*Assistant Examiner* — Stanetta D Isaac
(74) *Attorney, Agent, or Firm* — Syncoda LLC; Feng Ma

(57) ABSTRACT

A preparation method for a semiconductor structure includes the following operations. A bit line structure, active pillars, and a word line structure are formed in turn on a substrate. Bottom ends of the active pillars are connected to the bit line structure, and the active pillars are connected with the word line structure. A pillar-shaped conductive structure is formed on the active pillars, and a cup-shaped conductive structure is formed on the pillar-shaped conductive structure. There is an electrode gap between the pillar-shaped conductive structure and the cup-shaped conductive structure, and the pillar-shaped conductive structure and the cup-shaped conductive structure form a lower electrode. A dielectric layer is formed on a surface of the lower electrode. An upper electrode is formed on a surface of the dielectric layer. The upper electrode fills the electrode gap.

10 Claims, 20 Drawing Sheets

(58) Field of Classification Search
CPC ............ H01L 29/78642; H01L 21/762; H10D 62/115; H10D 30/6728
See application file for complete search history.

(56) References Cited

U.S. PATENT DOCUMENTS

| | | |
|---|---|---|
| 9,331,138 B2 | 5/2016 | Miyajima, deceased |
| 10,276,668 B2 | 4/2019 | Kim |
| 10,685,877 B2 | 6/2020 | Kim |
| 2012/0098092 A1 | 4/2012 | Park |
| 2014/0138794 A1 | 5/2014 | Yang |
| 2016/0005806 A1 | 1/2016 | Yang |
| 2018/0130665 A1* | 5/2018 | Park ................. H01L 29/40117 |
| 2018/0166320 A1 | 6/2018 | Kim |
| 2018/0166542 A1 | 6/2018 | Kim |
| 2020/0273744 A1 | 8/2020 | Kim |
| 2020/0395362 A1 | 12/2020 | Park |

* cited by examiner

PREPARATION METHOD FOR SEMICONDUCTOR STRUCTURE, SEMICONDUCTOR STRUCTURE AND SEMICONDUCTOR MEMORY

CROSS-REFERENCE TO RELATED APPLICATIONS

This is a continuation of International Application No. PCT/CN2021/110764 filed on Aug. 5, 2021, which claims priority to Chinese patent application No. 202110821150.9 filed on Jul. 20, 2021. The disclosures of these applications are hereby incorporated by reference in their entirety.

BACKGROUND

A Dynamic Random-Access Memory (DRAM) is a semiconductor storage device commonly used in computers, and may be composed of many repeated storage cells. With the evolution of semiconductor technologies, the rapid development of an integrated circuit manufacturing process, and the trend of miniaturization of various electronic products, the size of the manufacturing process is continuously reduced, and the design of DRAM is developed towards high integration and high density, especially the height of a DRAM capacitor is developed towards the direction of a high depth-to-width ratio. At the same time, it is necessary to guarantee enough capacitor storage capacity per unit area.

SUMMARY

Embodiments of the disclosure relate to, but are not limited to a preparation method for a semiconductor structure, the semiconductor structure and a semiconductor memory.

In a first aspect, an embodiment of the disclosure provides a preparation method for a semiconductor structure, which includes the following operations.

A substrate is provided.

A bit line structure, a plurality of active pillars, and a word line structure are formed in turn on the substrate. Bottom ends of the active pillars are connected to the bit line structure, and the active pillars are connected with the word line structure.

A pillar-shaped conductive structure is formed on the active pillars, and a cup-shaped conductive structure is formed on the pillar-shaped conductive structure. There is an electrode gap between the pillar-shaped conductive structure and the cup-shaped conductive structure, and the pillar-shaped conductive structure and the cup-shaped conductive structure form a lower electrode.

A dielectric layer is formed on a surface of the lower electrode.

An upper electrode is formed on a surface of the dielectric layer. The upper electrode fills the electrode gap.

In a second aspect, an embodiment of the disclosure provides a semiconductor structure, and the semiconductor structure includes a substrate, a bit line structure, a plurality of active pillars, a word line structure, a pillar-shaped conductive structure, a cup-shaped conductive structure, a dielectric layer, and an upper electrode.

The bit line structure, the active pillars and the word line structure are located above the substrate. Bottom ends of the active pillars are connected to the bit line structure, and the active pillars are connected with the word line structure.

The pillar-shaped conductive structure is located above the active pillars.

The cup-shaped conductive structure is located above the pillar-shaped conductive structure. The cup-shaped conductive structure and the pillar-shaped conductive structure form a lower electrode of the semiconductor structure.

The dielectric layer is located on a surface of the lower electrode.

The upper electrode covers a surface of the dielectric layer and fills an electrode gap.

In a third aspect, an embodiment of the disclosure provides a semiconductor memory. The semiconductor memory includes a semiconductor structure. The semiconductor structure includes a substrate, a bit line structure, a plurality of active pillars, a word line structure, a pillar-shaped conductive structure, a cup-shaped conductive structure, a dielectric layer, and an upper electrode.

The bit line structure, the active pillars and the word line structure are located above the substrate. Bottom ends of the active pillars are connected to the bit line structure, and the active pillars are connected with the word line structure.

The pillar-shaped conductive structure is located above the active pillars.

The cup-shaped conductive structure is located above the pillar-shaped conductive structure. The cup-shaped conductive structure and the pillar-shaped conductive structure form a lower electrode of the semiconductor structure.

The dielectric layer is located on a surface of the lower electrode.

The upper electrode covers a surface of the dielectric layer and fills an electrode gap.

DETAILED DESCRIPTION

Figure 1:
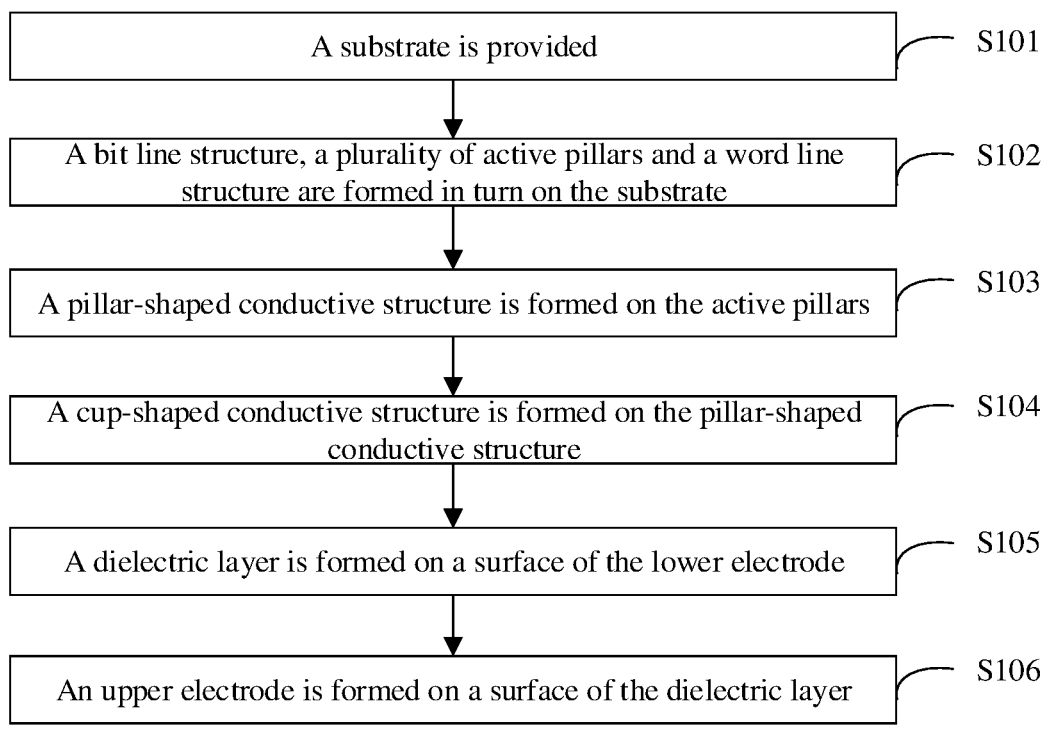
FIG. 1 is a flow schematic diagram of a preparation method for a semiconductor structure provided by an embodiment of the disclosure.

Technical schemes in embodiments of the disclosure are clearly and completely described below in combination with drawings in the embodiments of the disclosure. It may be understood that the specific embodiments described here are only used to explain the disclosure, but not to limit the disclosure. In addition, it should be noted that, for ease of description, only the parts related to the disclosure are shown in the drawings.

Unless otherwise defined, all technical and scientific terms used herein have the same meaning as commonly understood by those skilled in the technical field of the disclosure. Terminologies used herein are only for a purpose of describing the embodiments of the disclosure, and are not intended to limit the disclosure.

In the following descriptions, "some embodiments" are involved, it describes a subset of all possible embodiments, but it may be understood that "some embodiments" may be the same subset or different subsets of all possible embodiments, and may be combined with each other in the case without conflicting.

It should be pointed out that terms "first/second/third" involved in the embodiments of the disclosure only distinguish similar objects, and do not represent a specific order for the objects. Understandably, the "first/second/third" may interchange the specific sequence or precedence order in the case of permission, so that the embodiments of the disclosure described herein may be implemented in a sequence other than those illustrated or described herein.

For a high depth-to-width ratio, in order to maintain the enough capacitor storage capacity, it may be difficult for a capacitor structure to maintain the enough stability.

With the evolution of semiconductor technologies, the rapid development of an integrated circuit manufacturing process, and the trend of miniaturization of various electronic products, the size of the manufacturing process is continuously reduced, and the design of DRAM is developed towards high integration and high density. The height of a DRAM capacitor is developed towards the direction of a high depth-to-width ratio, and at the same time, it is necessary to guarantee enough capacitor storage capacity per unit area.

However, in the case of the high depth-to-width ratio, it is difficult for a semiconductor structure to maintain the enough capacitor storage capacity while the enough stability is also maintained. A semiconductor structure provided by an embodiment of the disclosure may improve the storage capacity of a capacitor while the stability of the capacitor is guaranteed.

The embodiments of the disclosure are described below in detail with reference to the drawings.

In an embodiment of the disclosure, referring to FIG. 1, it shows a flow schematic diagram of a preparation method for a semiconductor structure provided by the embodiment of the disclosure. As shown in FIG. 1, the method may include the following operations.

At S101, a substrate is provided.

The substrate may be a silicon substrate or other suitable substrate materials such as silicon, germanium, and silicon germanium compounds, and it is not specifically limited in the embodiment of the disclosure.

At S102, a bit line structure, a plurality of active pillars and a word line structure are formed in turn on the substrate.

Bottom ends of the active pillars are connected to the bit line structure, and the active pillars are connected with the word line structure.

In some embodiments, the operation of forming a bit line structure, a plurality of active pillars, and a word line structure in turn on the substrate may include the following operations.

The bit line structure is formed on the substrate, and the bit line structure extends along a first direction.

The active pillars and the word line structure are formed on the bit line structure, and the word line structure extends along a second direction.

In an embodiment, the operation of forming a bit line structure on the substrate may include the following operations.

A first isolation structure and the bit line structure are formed above the substrate, and the first isolation structure and the bit line structure are located in the same plane.

The first isolation structure is etched to form a bit line gap.

A second isolation structure is formed above the bit line structure and the first isolation structure.

Figure 2:
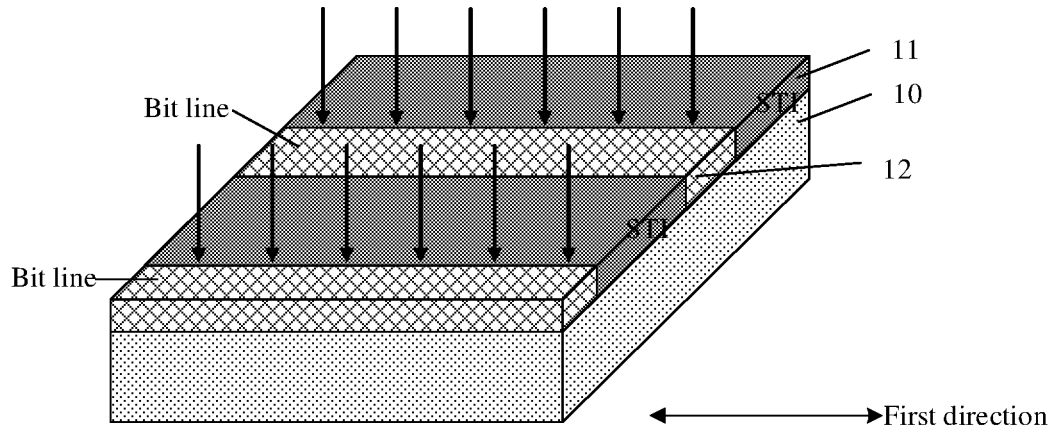
FIG. 2 is a first three-dimensional structure schematic diagram corresponding to a step S102 in a preparation method for a semiconductor structure provided by an embodiment of the disclosure.

Referring to FIG. 2, a substrate 10 is provided, and a first isolation structure 11 and a bit line structure 12 are formed above the substrate 10. The first isolation structure 11 serves as a Shallow Trench Isolation (STI) structure of the semiconductor structure. The material of the first isolation structure includes one or more of suitable materials such as silicon dioxide and silicon nitride. The first isolation structure 11 may be formed in the mode of deposition formation.

For example, a plurality of grooves arranged at intervals may be formed on the substrate 10, and the first isolation structure 11 may be formed in the groove by deposition, so as to obtain the substrate including the first isolation structure, and then the bit line structure 12 is formed on the substrate between the first isolation structures 11. In the embodiment of the disclosure, the bit line structure 12 is formed on a surface of the substrate between the first isolation structures 11, and extends along the first direction, and the first isolation structure 11 and the bit line structure 12 are located in the same plane. For example, the bit line structure 12 may be formed by doping the semiconductor substrate 12 with one or more of suitable materials such as boron (B), phosphorus (P), arsenic (As), and germanium (Ge).

In some embodiments, in order to avoid conduction between the bit line structure 12 and the substrate 10, the method may further include the following operation. An insulating layer 15 is formed by deposition between the substrate 10 and the bit line structure 12. The material of the insulating layer 15 may include one or more of suitable materials such as silicon dioxide. The bit line structure 12 and the first isolation structure 11 may be formed through the following steps. A semiconductor material layer, such as a monocrystalline silicon layer, is formed on the insulating layer 15 by an epitaxial method. Grooves distributed at intervals are formed on the semiconductor material layer, and the grooves are filled with an isolation material to form the first isolation structure 11. The semiconductor material layer between the first isolation structures 11 is doped with one or more of suitable materials such as B, P, As and Ge to form the bit line structure 12.

Figure 3:
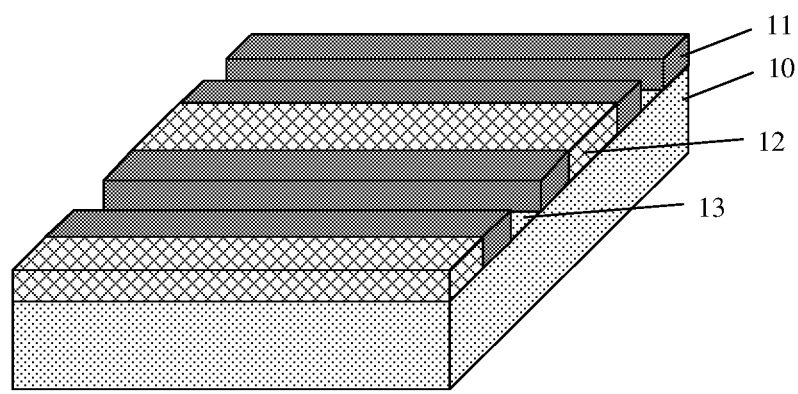
FIG. 3 is a second three-dimensional structure schematic diagram corresponding to a step S102 in a preparation method for a semiconductor structure provided by an embodiment of the disclosure.

Referring to FIG. 3, the first isolation structure 11 is etched to form an opening between the first isolation structures 11, namely a bit line gap 13. The bit line gap 13 is beneficial to reduction of the parasitic capacitance between bit lines.

Figure 4:
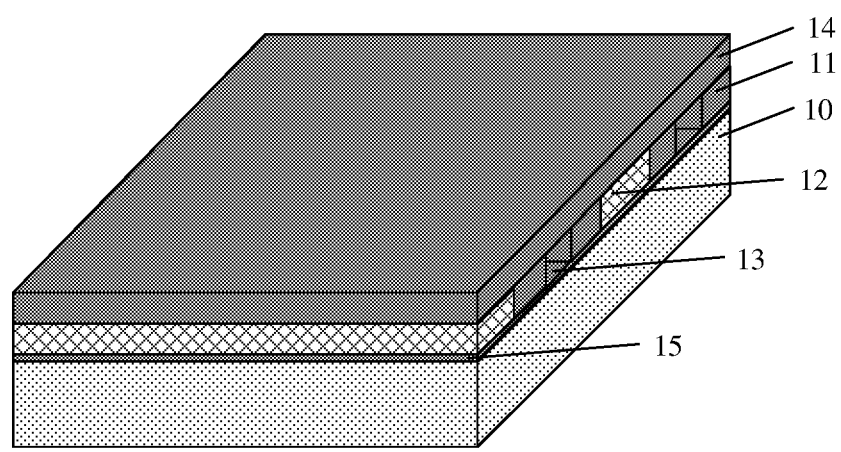
FIG. 4 is a third three-dimensional structure schematic diagram corresponding to a step S102 in a preparation method for a semiconductor structure provided by an embodiment of the disclosure.

Referring to FIG. 4, a second isolation structure 14 is formed above the bit line structure 12 and the first isolation structure 11, and the second isolation structure 14 may be formed in the mode of deposition formation, such as Low-Pressure Chemical Vapor Deposition (LPCVD). The material of the second isolation structure 14 may include one or more of suitable materials such as silicon dioxide ($SiO_2$) and silicon oxynitride (SiON).

In an embodiment, the operation of forming a plurality of active pillars and a word line structure on the bit line structure may include the following operations.

The second isolation structure is etched to form an active opening.

Active pillars are formed at the active opening.

A conductive layer is formed above the second isolation structure.

The conductive layer is etched to form the word line gap and obtain the word line structure.

A third isolation structure is formed above the word line structure.

Figure 5:
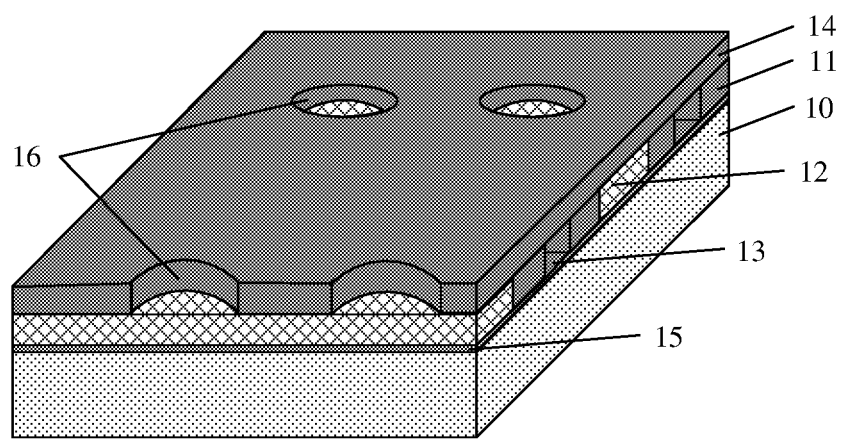
FIG. 5 is a fourth three-dimensional structure schematic diagram corresponding to a step S102 in a preparation method for a semiconductor structure provided by an embodiment of the disclosure.

Referring to FIG. 5, the second isolation structure 14 is etched to form a plurality of active openings 16. In the embodiment of the disclosure, the active openings 16 may be arranged in a mode of a square, a rectangle or other array arrangement, and this is not limited in the embodiment of the disclosure.

The bit line structure 12 is located below source electrodes or drain electrodes of the active pillars in the same row, and the active pillars need to be connected with the bit line structure 12. Therefore, the active opening 16 must guarantee that the bit line structure 12 is exposed. In the embodiment of the disclosure, the shape of the active opening 16 may be a circle or an ellipse.

Figure 6:
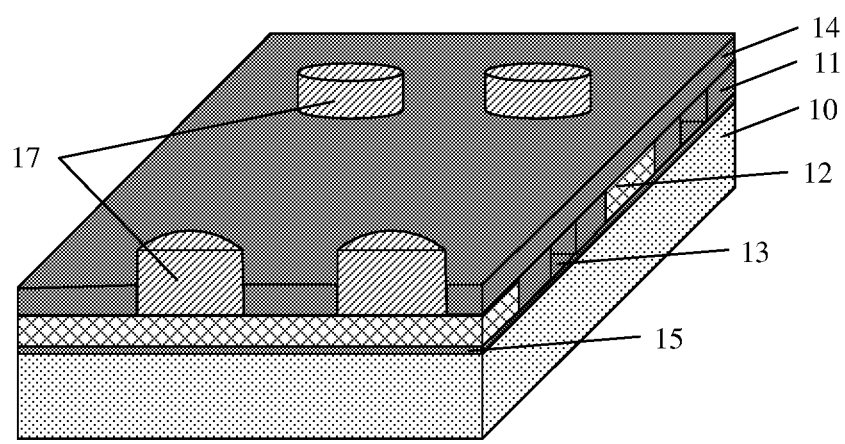
FIG. 6 is a fifth three-dimensional structure schematic diagram corresponding to a step S102 in a preparation method for a semiconductor structure provided by an embodiment of the disclosure.

Referring to FIG. 6, the active pillar 17 is formed at the active opening 16. In the embodiment of the disclosure, the active pillar 17 may be formed by the epitaxial method, and the material of the active pillar 17 may include monocrystalline silicon. Exemplarily, the height of the active pillar 17 may be higher than the height of the active opening 16.

Figure 7:
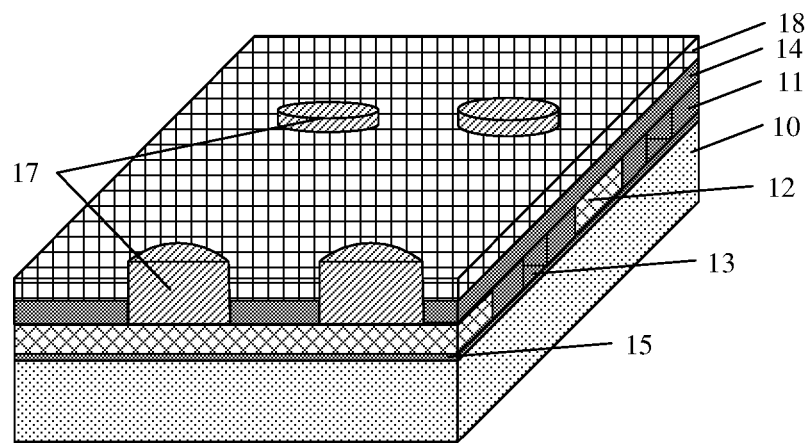
FIG. 7 is a sixth three-dimensional structure schematic diagram corresponding to a step S102 in a preparation method for a semiconductor structure provided by an embodiment of the disclosure.

Referring to FIG. 7, a conductive layer 18 is formed above the second isolation structure 14, and the conductive layer 18 covers part of a surface of the active pillar 17, and the conductive layer 18 is formed above the second isolation structure 14 to surround the active pillar 17. The conductive layer 18 may be formed in a mode such as Physical Vapor Deposition (PVD), Chemical Vapor Deposition (CVD) or Atomic Layer Deposition (ALD), and the material of the conductive layer 18 may include one or more of suitable materials such as titanium nitride (TiN) and tungsten (W).

In some embodiments, before forming a word line structure above the second isolation structure, the method may further include the following operation.

A gate oxide layer is formed on a side surface of the active pillar.

In the embodiment of the disclosure, before the conductive layer 18 is formed, the method may further include a step of forming the gate oxide layer (unshown in the figure) on the side surface of the active pillar 17.

For example, the second isolation structure 14 around the active pillar 17 is etched back through for example a dry etching method such as plasma etching, so as to expose a pillar side surface of the active pillar 17, and the gate oxide layer is formed on the pillar side surface of the active pillar by modes such as thermal oxidation.

In some embodiments, in a process of forming the gate oxide layer, the gate oxide layer is also formed on a top surface of the active pillar 17, and the gate oxide layer on the top surface of the active pillar 17 needs to be removed, for example, removed by an etching method.

Figure 8:
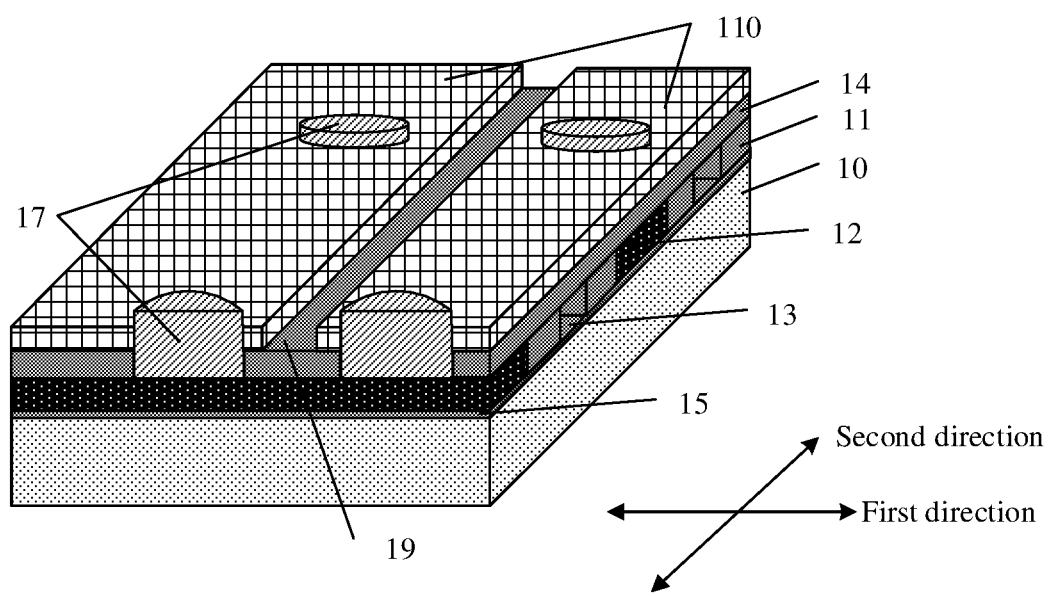
FIG. 8 is a seventh three-dimensional structure schematic diagram corresponding to a step S102 in a preparation method for a semiconductor structure provided by an embodiment of the disclosure.

Referring to FIG. 8, the conductive layer 18 is etched to form a word line gap 19 and obtain a word line structure 110. The word line gap 19 is beneficial to reduction of interference between word lines.

In the embodiment of the disclosure, the word line structure 110 extends along a second direction, and the second direction and the first direction are not parallel, namely extension directions of the bit line structure 12 and the word line structure 110 are not parallel. In FIG. 8, for example, the first direction is perpendicular to the second direction.

In some embodiments, while the conductive layer 18 is etched to form the word line gap 19, the second isolation structure 14 may also be partially or completely etched in the same position, namely the length of the word line gap 19 in a perpendicular direction may be the same as the height of the conductive layer 18, or may extends downwards to be longer than the height of the conductive layer 18. In the semiconductor structure shown in FIG. 8, the length of the word line gap is equal to the height of the conductive layer 18.

Figure 9:
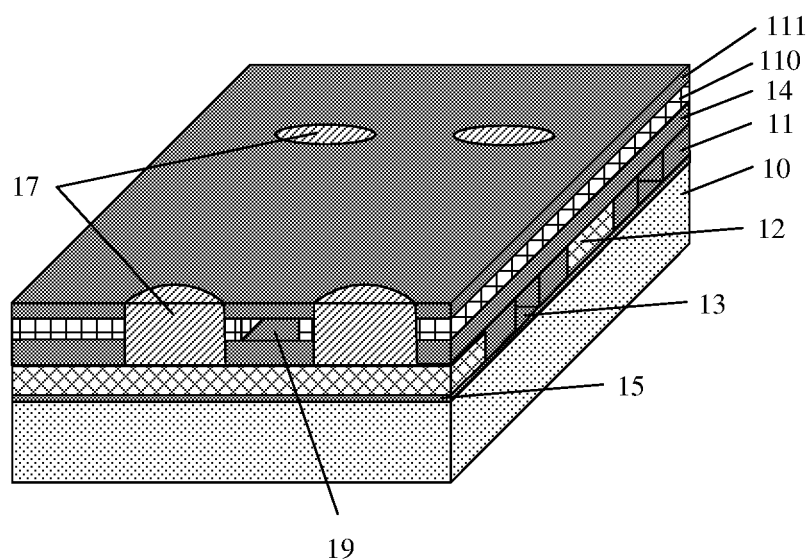
FIG. 9 is an eighth three-dimensional structure schematic diagram corresponding to a step S102 in a preparation method for a semiconductor structure provided by an embodiment of the disclosure.

Referring to FIG. 9, a third isolation structure 111 is formed above the word line structure 110, and a top surface of the third isolation structure 111 and a top surface of the active pillar 17 are located in the same plane. The third isolation structure 111 may be formed by CVD, and the material of the third isolation structure 111 may include one or more of suitable materials such as silicon dioxide and silicon oxynitride. In other embodiments, the top surface of the third isolation structure 111 may also be lower or higher than the top surface of the active pillar 17.

At S103, a pillar-shaped conductive structure is formed on the active pillars.

In the embodiment of the disclosure, the pillar-shaped conductive structure is formed on the active pillars.

In an embodiment, the operation of forming a pillar-shaped conductive structure on the active pillars may include the following operations.

A first support layer is formed above the active pillars.

A first sacrifice layer is formed above the first support layer.

A second support layer is formed above the first sacrifice layer.

A first opening is formed in the second support layer, the first sacrifice layer and the first support layer. The first opening is opposite to the active pillars.

A pillar-shaped conductive structure is formed in the first opening.

Figure 10:
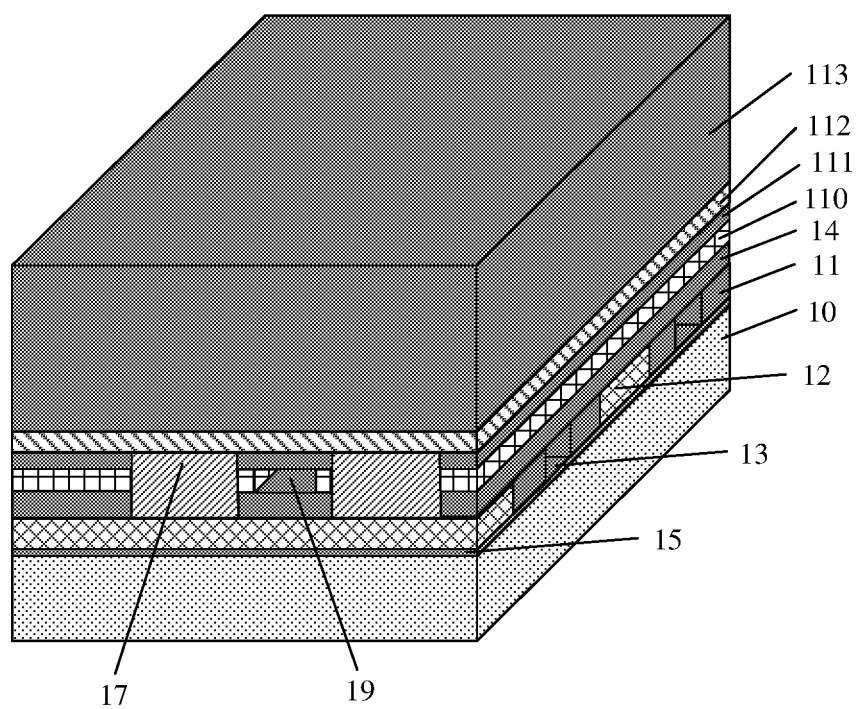
FIG. 10 is a first three-dimensional structure schematic diagrams corresponding to a step S103 in a preparation method for a semiconductor structure provided by an embodiment of the disclosure.

Referring to FIG. 10, the first support layer 112 is formed above the active pillars 17, for example, the first support layer 112 is formed above the active pillars 17 and the third isolation structure 111. The first sacrifice layer 113 is formed above the first support layer 112. The first support layer 112 may be formed by methods such as PVD, CVD, or ALD, and the material of the first support layer 112 may include silicon nitride. The first sacrifice layer 113 may be formed by methods such as PVD, CVD, or ALD, and the material of the first sacrifice layer 113 may include silicon dioxide.

Figure 11:
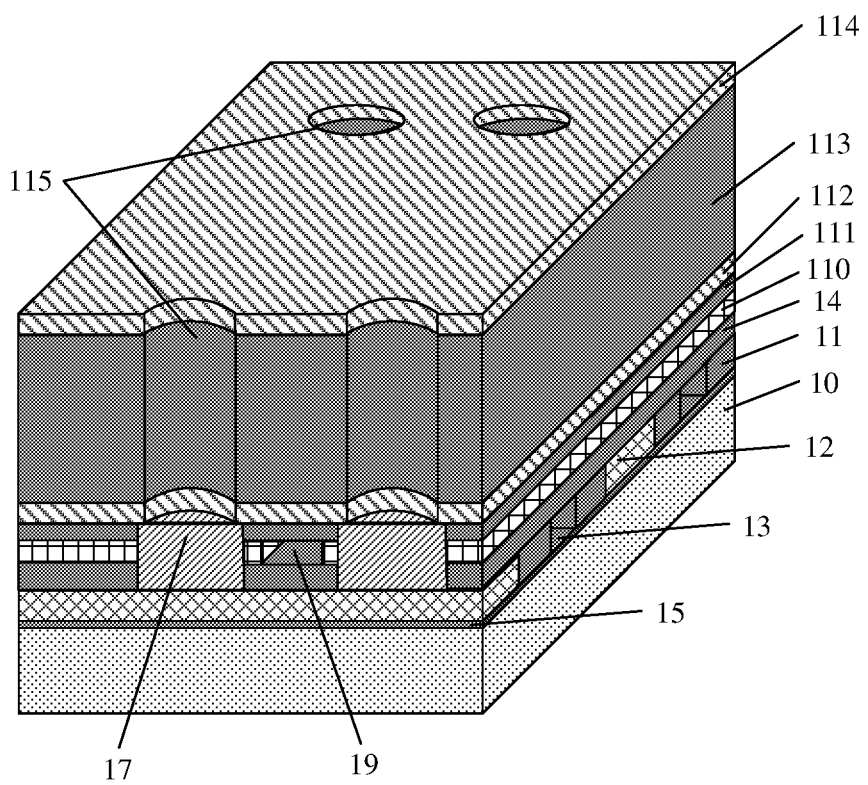
FIG. 11 is a second three-dimensional structure schematic diagrams corresponding to a step S103 in a preparation method for a semiconductor structure provided by an embodiment of the disclosure.

Referring to FIG. 11, the second support layer 114 is formed above the first sacrifice layer 113, and the first opening 115 is formed in the second support layer 114, the first sacrifice layer 113 and the first support layer 112, and the first opening 115 is opposite to the active pillar 17, so that the pillar-shaped conductive structure formed subsequently is connected with the active pillar 17.

The second support layer 114 may be formed by methods such as PVD, CVD, or ALD, and the material of the second support layer 114 may include silicon nitride. The first opening 115 may be formed by processes such as lithography and etching.

Figure 12:
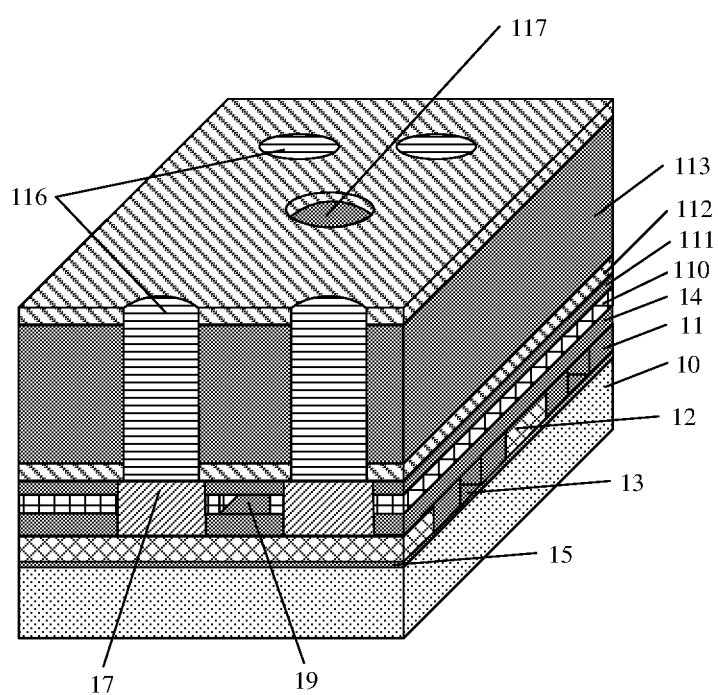
FIG. 12 is a third three-dimensional structure schematic diagrams corresponding to a step S103 in a preparation method for a semiconductor structure provided by an embodiment of the disclosure.

Referring to FIG. 12, the pillar-shaped conductive structure 116 is formed in the first opening 115. The pillar-shaped conductive structure 116 may be formed by methods such as PVD, CVD, or ALD, and the material of the pillar-shaped conductive structure 116 may include one or more of suitable materials such as silicon nitride, tungsten, and titanium tungsten. Exemplarily, the pillar-shaped conductive structure 116 is completely formed in the first opening 115.

Before or after the pillar-shaped conductive structure 116 is formed (for example, while the first opening 115 is formed), the method may further include an operation of forming a plurality of first etchant inlets 117 in the second support layer 114. For example, the second support layer 114 is etched to form the first etchant inlets 117 (only one first etchant inlet 117 is shown in FIG. 12 as an example), and the shape of the first etchant inlet 117 includes a circle, an ellipse, a triangle, a five-pointed star or a hexagon and the like. Here, only the circle is used as an example.

In some embodiments, while the second support layer 114 is etched to form the first etchant inlet 117, the first sacrifice layer 113 may also be partially etched.

At S104, a cup-shaped conductive structure is formed on the pillar-shaped conductive structure.

In the embodiment of the disclosure, the cup-shaped conductive structure is formed on the pillar-shaped conductive structure, and there is an electrode gap between the pillar-shaped conductive structure and the cup-shaped conductive structure, and the pillar-shaped conductive structure and the cup-shaped conductive structure form a lower electrode.

In an embodiment, the operation of forming the cup-shaped conductive structure on the pillar-shaped conductive structure may include the following operations.

A second sacrifice layer is formed above the second support layer.

A third support layer is formed above the second sacrifice layer.

A second opening is formed in the third support layer and the second sacrifice layer.

The cup-shaped conductive structure is formed in the second port.

The second opening is opposite to the first opening, and the size of the second opening is greater than the size of the first opening. In other embodiments, the size of the second opening may also be less than or equal to the size of the first opening.

Figure 13:
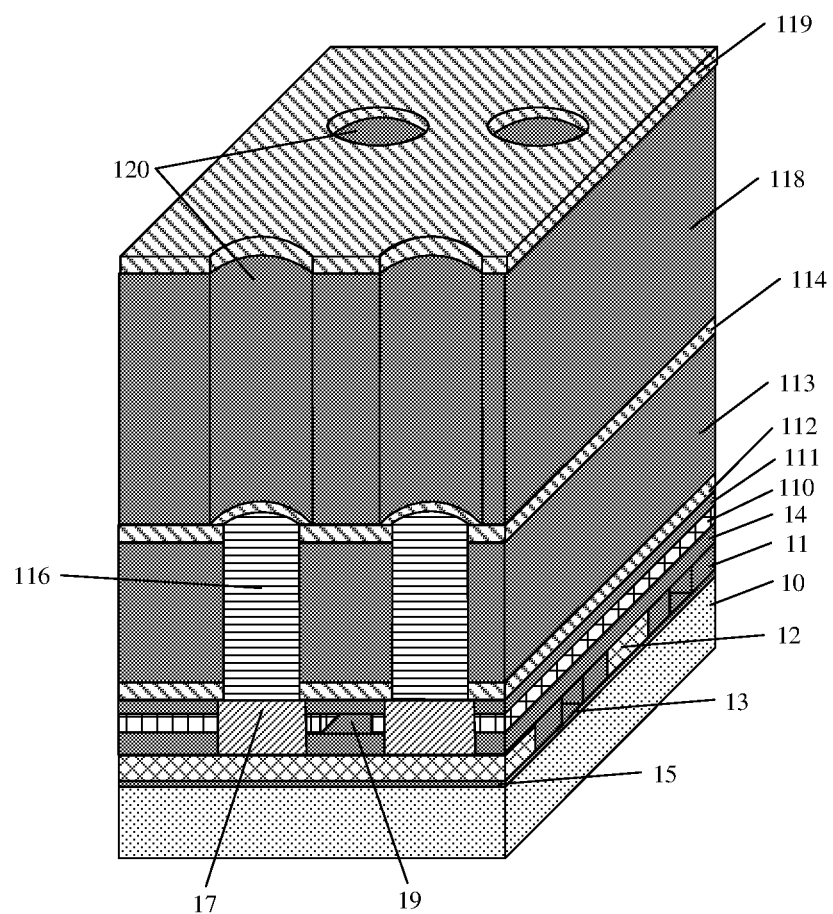
FIG. 13 is a first schematic diagram of three-dimensional structure corresponding to a step S104 in a preparation method for a semiconductor structure provided by an embodiment of the disclosure.

Referring to FIG. 13, the second sacrifice layer 118 is formed above the second support layer 114, the third support layer 119 is formed above the second sacrifice layer 118, and the second opening 120 is formed in the third support layer 119 and the second sacrifice layer 118.

The second sacrifice layer 118 may be formed by a process method such as PVD or CVD, and the material of the second sacrifice layer 118 may include silicon dioxide.

The third support layer 119 may be formed by a process method such as PVD or CVD, and the material of the third support layer 119 may include silicon nitride. The second opening 120 may be formed by processes such as lithography and etching.

The second opening 120 is opposite to the first opening 115, namely opposite to the pillar-shaped conductive structure 116, and exposes the pillar-shaped conductive structure 116, so that the cup-shaped conductive structure may be connected with the pillar-shaped conductive structure 116 while the cup-shaped conductive structure is formed subsequently.

In the embodiment of the disclosure, the lower electrode is formed by the cup-shaped conductive structure subsequently formed in the second opening 120 and the pillar-shaped conductive structure 116 together. While the second opening 120 is formed and the pillar-shaped conductive structure 116 is exposed, a part of the second support layer 114 may also be etched at the same time, and the second opening 120 further includes a partial opening formed by etching the second support layer 114.

Figure 14:
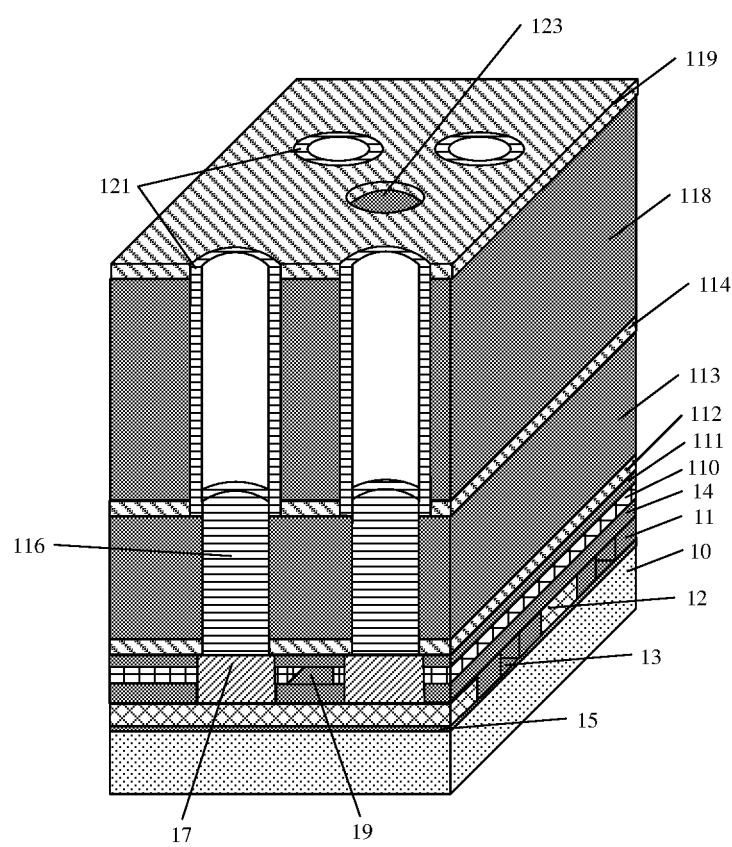
FIG. 14 is a second schematic diagram of three-dimensional structure corresponding to a step S104 in a preparation method for a semiconductor structure provided by an embodiment of the disclosure.

Referring to FIG. 14, the cup-shaped conductive structure 121 is formed in the second opening 120. For example, the cup-shaped conductive structure 121 may be formed by methods such as PVD, CVD, or ALD, and the material of the cup-shaped conductive structure 121 may include conductive materials such as titanium nitride. The cup-shaped conductive structure 121 may be formed on the inner wall of the second opening 120. In other embodiments, it may also be formed on the bottom wall of the second opening 120. For example, the cup-shaped conductive structure 121 may also be formed on the top of the pillar-shaped conductive structure 116 exposed by the second opening 120.

In the embodiment of the disclosure, the lower electrode 122 is formed by the pillar-shaped conductive structure 116 and the cup-shaped conductive structure 121 together. A difference between the pillar-shaped conductive structure 116 and the cup-shaped conductive structure 121 is that the pillar-shaped conductive structure 116 fills the first opening 115 and is shaped like a pillar, and the cup-shaped conductive structure 121 is formed on the inner wall of the second opening 120 and is shaped like a cup. Moreover, the size of the second opening 120 is greater than the size of the first opening 116, so that the size (diameter) of the cup-shaped conductive structure 121 is also greater than the size (diameter) of the pillar-shaped conductive structure 116, through such a lower electrode structure that "a cup is upper and a pillar is lower" and "the diameter of the cup is greater than the diameter of the pillar", the stability of the structure is improved while the high depth-to-width ratio may be guaranteed.

As shown in FIG. 14, in order to better represent the cup-shaped conductive structure 121, the inner wall thereof is marked as colorless, but it may be understood that the inner wall thereof includes a deposited conductive material.

Before or after forming the cup-shaped conductive structure 121 (for example, while forming the second opening 120), the method may further include an operation of forming a plurality of second etchant inlets 123 in the third support layer 119. For example, the third support layer 119 is etched to form the second etchant inlets 123 (only one second etchant inlet 123 is shown in FIG. 14 as an example), and the shape of the second etchant inlet 123 includes a circle, an ellipse, a triangle, a five-pointed star or a hexagon and the like. Here, only the circle is used as an example.

In some embodiments, while the third support layer 119 is etched to form the second etchant inlet 123, the second sacrifice layer 118 may also be partially etched.

In some embodiments, after the cup-shaped conductive structure is formed in the second opening, the method may further include the following operations.

A first etchant inlet and a second etchant inlet are formed in the second support layer and the third support layer respectively.

The first etchant inlet and the second etchant inlet are used to remove the first sacrifice layer and the second sacrifice layer.

Figure 15:
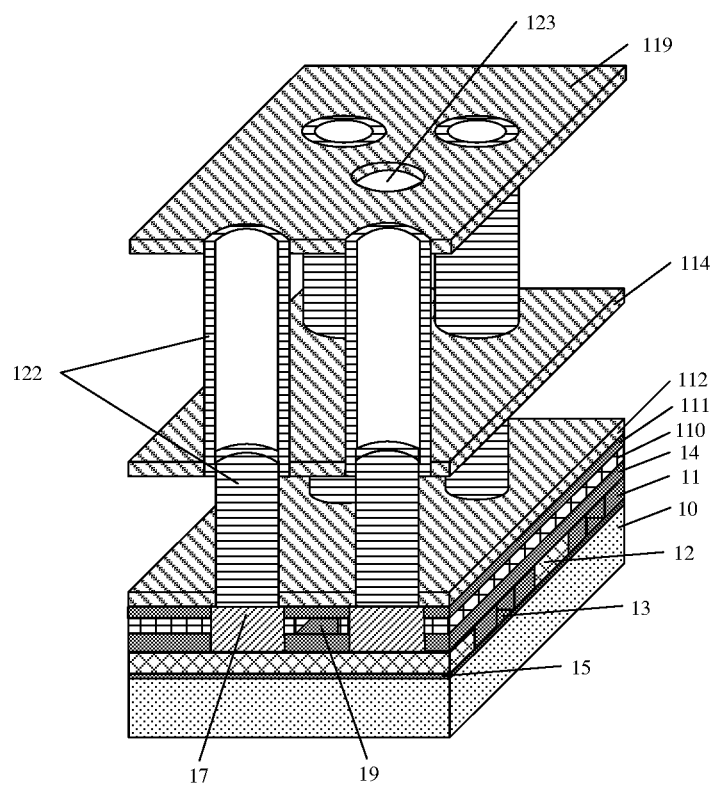
FIG. 15 is a third schematic diagram of three-dimensional structure corresponding to a step S104 in a preparation method for a semiconductor structure provided by an embodiment of the disclosure.

Referring to FIG. 15, the second sacrifice layer 118 and the first sacrifice layer 113 may be removed by a mode of wet etching. An etchant is introduced through the second etchant inlet 123 and the first etchant inlet 117, and the two are in communication, so that the second sacrifice layer 118 and the first sacrifice layer 113 are etched and removed.

For example, while the etchant is introduced through the second etchant inlet 123, part or the entire of the second sacrifice layer 118 is firstly etched and removed, and then the first etching inlet 117 is exposed, the etchant may enter the first sacrifice layer 113, and the first sacrifice layer 113 is removed.

In the embodiment of the disclosure, the lower electrode 122 is formed by the pillar-shaped conductive structure 17 and the cup-shaped conductive structure 116 together.

At S105, a dielectric layer is formed on a surface of the lower electrode.

Figure 16A:
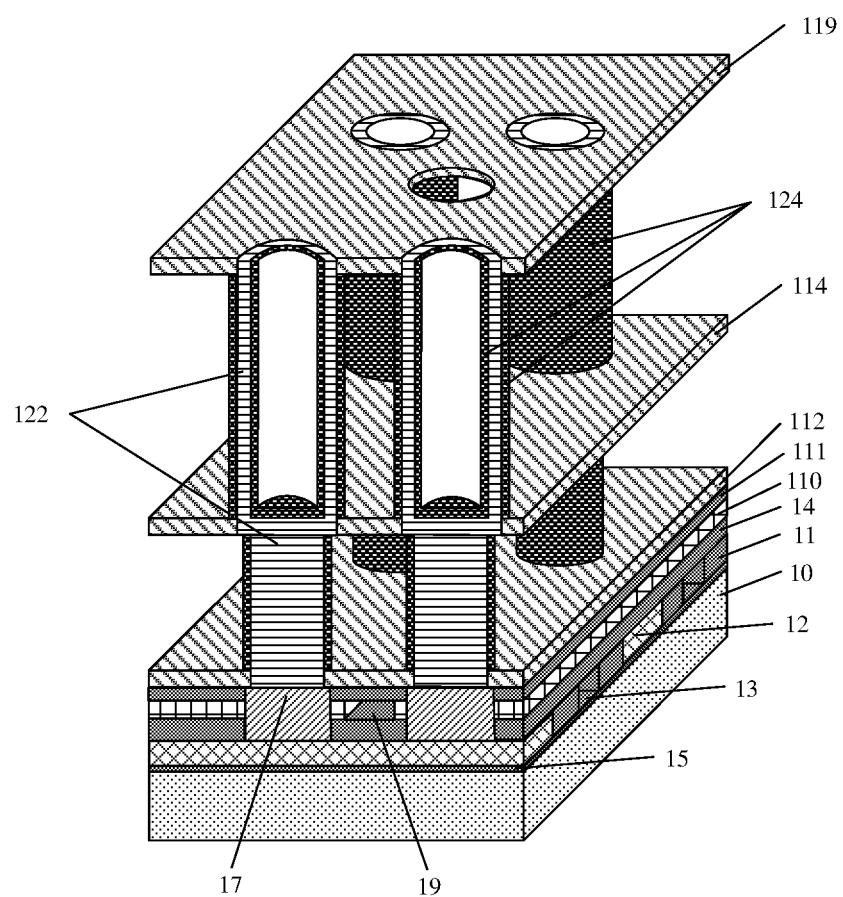
FIG. 16A is a schematic diagram of three-dimensional structure corresponding to a step S105 in a preparation method for a semiconductor structure provided by an embodiment of the disclosure.

Referring to FIG. 16A, the formation of the dielectric layer 124 on the surface of the lower electrode 122 includes the following operations. The dielectric layer 124 is formed on an outer surface of the pillar-shaped conductive structure 17, and the dielectric layer 124 is formed on an inner surface and an outer surface of the cup-shaped conductive structure 121. The method of forming the dielectric layer 124 may include PVD, CVD, or ALD and the like. The material of the dielectric layer 124 may include high dielectric materials such as zirconium oxide (ZrO), hafnium oxide (HfO), and aluminum oxide ($Al_2O_3$).

Figure 16B:
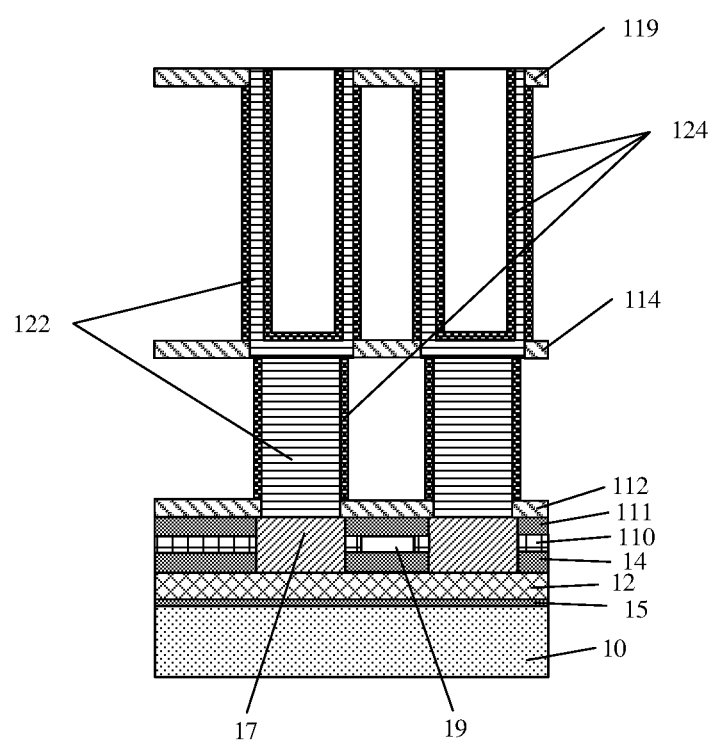
FIG. 16B is a cross-sectional schematic diagram corresponding to a step S105 in a preparation method for a semiconductor structure provided by an embodiment of the disclosure.

Referring to FIG. 16B, it shows a cross-section schematic diagram (front view direction) of a structure obtained in this step.

At S106, an upper electrode is formed on a surface of the dielectric layer.

For example, the upper electrode fills the electrode gap.

Figure 17A:
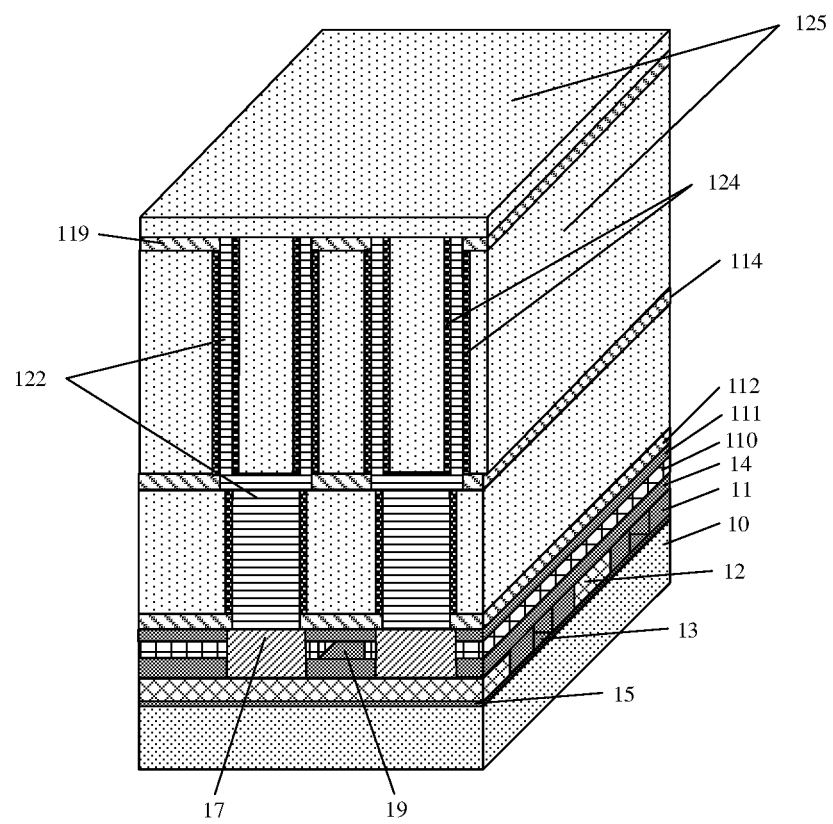
FIG. 17A is a schematic diagram of three-dimensional structure corresponding to a step S106 in a preparation method for a semiconductor structure provided by an embodiment of the disclosure.

Referring to FIG. 17A, the upper electrode 125 is formed on the surface of the dielectric layer, and the upper electrode 125 fills the electrode gap. The electrode gap may include a gap formed after etching the first sacrifice layer 113 and the second sacrifice layer 118, and a gap inside the cup-shaped conductive structure 121, and not include the bit line gap 13 and the word line gap 19. The method of forming the upper electrode 125 may be PVD, CVD, or ALD and the like, and the material of the upper electrode 125 may include polysilicon, silicon germanium, or titanium nitride and the like.

Figure 17B:
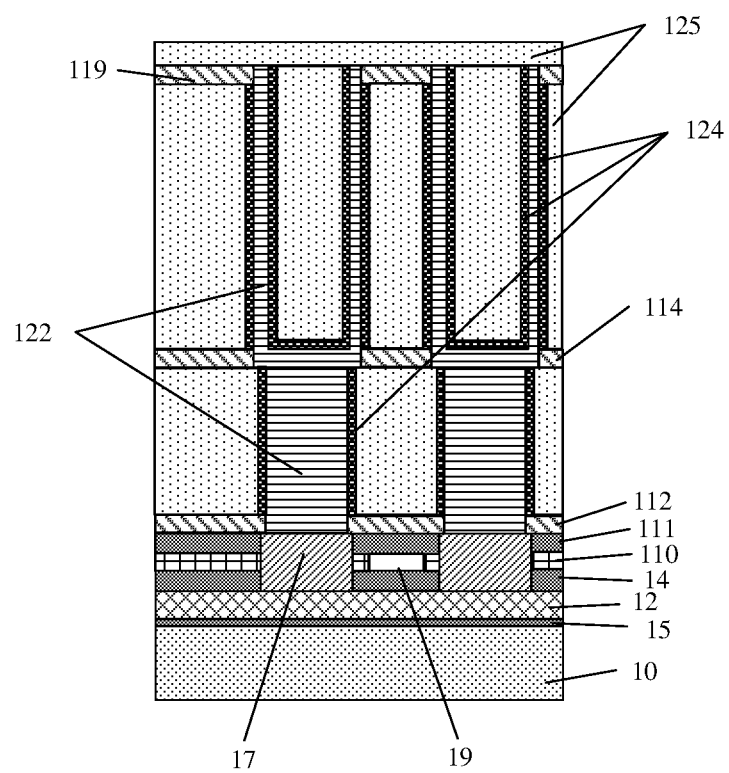
FIG. 17B is a cross-sectional schematic diagram corresponding to a step S106 in a preparation method for a semiconductor structure provided by an embodiment of the disclosure.

Referring to FIG. 17B, it shows a cross-section schematic diagram (front view direction) of a structure obtained in this step.

In some embodiments, after a cup-shaped conductive structure is formed on the pillar-shaped conductive structure, the method may further include the following operation.

The steps of forming the pillar-shaped conductive structure and forming the cup-shaped conductive structure on the pillar-shaped conductive structure are cyclically performed above the cup-shaped conductive structure, until the number of the cup-shaped structures reaches a preset number, as to form the lower electrode.

It should be noted that, in the embodiment of the disclosure, the step of forming the pillar-shaped conductive structure and the cup-shaped conductive structure may be repeated, until the number of the cup-shaped conductive structures reaches the preset number, thereby the lower electrode including a plurality of layers of "pillar-shaped conductive structure—cup-shaped conductive structure" is obtained.

In addition, in the embodiments of the disclosure, "formation", "deposition", "etching" and the like may be formed by any processes suitable for existing materials.

In the preparation method for the semiconductor structure provided by the embodiment of the disclosure, the lower electrode structure of which the bottom is pillar-shaped and the upper is cup-shaped is formed to obtain the semiconductor structure with the stable structure. In addition, the distance between the word line and the bit line is relatively small, and the embodiment of the disclosure reduces the mutual interference between word lines, between bit lines and between the bit line and the word line through the word line gap and the bit line gap. In the semiconductor structure obtained by the preparation method of the embodiment of the disclosure, the lower part of the lower electrode is a pillar structure (pillar-shaped conductive structure), the upper part of the lower electrode is a cup structure (cup-shaped conductive structure), and the diameter of the pillar structure is less than the diameter of the cup structure, so that the semiconductor structure is more stable. In the embodiment of the disclosure, a manufacturing process of the pillar structure and the cup structure may also be repeated to form a stacked structure with more than two layers (the two layers refer to one layer of the pillar structure and one layer of the cup structure). In addition, since gaps are formed between the word lines and the bit lines, the preparation method of the embodiment of the disclosure may also reduce read and write interference.

This embodiment provides a preparation method for a semiconductor structure. A substrate is provided. A bit line structure, a plurality of active pillars, and a word line structure are formed in turn on the substrate. Bottom ends of the active pillars are connected to the bit line structure, and the active pillars are connected with the word line structure. A pillar-shaped conductive structure is formed on the active pillar, and a cup-shaped conductive structure is formed on the pillar-shaped conductive structure. There is an electrode gap between the pillar-shaped conductive structure and the cup-shaped conductive structure, and a lower electrode is formed by the pillar-shaped conductive structure and the cup-shaped conductive structure together. A dielectric layer is formed on a surface of the lower electrode. An upper electrode is formed on a surface of the dielectric layer, and the upper electrode fills the electrode gap. In this way, by forming the lower electrode of which the lower part is the pillar-shaped conductive structure and the upper part is the cup-shaped conductive structure, the storage capacity of the capacitor is increased while the stability of the semiconductor structure is also improved.

In another embodiment of the disclosure, FIG. 17A shows a three-dimensional structure schematic diagram of a semiconductor structure provided by an embodiment of the disclosure, and FIG. 17B shows a cross-section schematic diagram of a semiconductor structure provided by an embodiment of the disclosure. As shown in FIG. 17A and FIG. 17B, the semiconductor structure may include a substrate 10, a bit line structure 12, a plurality of active pillars 17, a word line structure 110, a pillar-shaped conductive structure, a cup-shaped conductive structure, a dielectric layer 124, and an upper electrode 125.

The bit line structure 12, the active pillars 17 and the word line structure 110 are located above the substrate 10. Bottom ends of the active pillars 17 are connected to the bit line structure 12, and the active pillars 17 are connected with the word line structure 110.

The pillar-shaped conductive structure is located above the active pillars 17.

The cup-shaped conductive structure is located above the pillar-shaped conductive structure. A lower electrode 122 of the semiconductor structure is formed by the cup-shaped conductive structure and the pillar-shaped conductive structure together.

The dielectric layer 124 is located on a surface of the lower electrode 122.

The upper electrode 125 covers a surface of the dielectric layer 124 and fills an electrode gap.

In some embodiments, the bit line structure 12 is located on the substrate 10, and the bit line structure 12 extends along a first direction.

The active pillars 17 and the word line structure 110 are located on the bit line structure 12, and the word line structure 110 extends along a second direction.

In some embodiments, the semiconductor structure may further include a first isolation structure 11 and a bit line gap 13 located in the first isolation structure. The first isolation structure 11 and the bit line structure 12 are formed in the same plane.

In some embodiments, the semiconductor structure may further include an insulating layer 15 between the bit line structure 12 and the substrate 10.

In some embodiments, the semiconductor structure may further include a second isolation structure 14, and the second isolation structure 14 is located above the bit line structure 12 and the first isolation structure 11. The word line structure 110 is located above the second isolation structure 14, and there is a word line gap 19 between word line structures 110.

In some embodiments, the semiconductor structure may further include a third isolation structure 111. The third isolation structure 111 is located above the word line structure 110, and a top surface of the third isolation structure 111 and a top surface of the active pillar 17 are located in the same plane.

In some embodiments, the semiconductor structure may further include a gate oxide layer (unshown in the figure). The gate oxide layer covers a pillar side surface of the active pillar 17.

In some embodiments, the semiconductor structure may further include a first support layer 112 located on the active pillar 17, a second support layer 114 located on the top of the pillar-shaped conductive structure, and a third support layer located on the top of the cup-shaped conductive structure 119.

In some embodiments, the size of a cross section, perpendicular to the extension direction thereof, of the cup-shaped conductive structure is greater than the size of a cross section, perpendicular to the extension direction thereof, of the pillar-shaped conductive structure.

In some embodiments, the semiconductor structure may further include a plurality of groups of the stacked pillar-shaped conductive structures and cup-shaped conductive structures.

This embodiment provides a semiconductor structure, and the semiconductor structure includes a substrate, a bit line structure, a plurality of active pillars, a word line structure, a pillar-shaped conductive structure, a cup-shaped conductive structure, a dielectric layer, and an upper electrode. The bit line structure, the active pillars and the word line structure are located above the substrate. Bottom ends of the active pillars are connected to the bit line structure, and the active pillars are connected with the word line structure. The pillar-shaped conductive structure is located above the active pillars. The cup-shaped conductive structure is located above the pillar-shaped conductive structure. The semiconductor structure is formed by the cup-shaped conductive structure and the pillar-shaped conductive structure form a lower electrode. The dielectric layer is located on a surface of the lower electrode. The upper electrode covers a surface of the dielectric layer and fills an electrode gap. In this way, since the lower part of the lower electrode of the semiconductor structure is the pillar-shaped conductive structure, and the upper part is the cup-shaped conductive structure, the storage capacity of the capacitor is increased while it also makes the semiconductor structure more stable. In addition, because the size of the cross section, perpendicular to the extension direction thereof, of the cup-shaped conductive structure is greater than the size of the cross section, perpendicular to the extension direction thereof, of the pillar-shaped conductive structure, the stability of the semiconductor structure is further improved. Moreover, since the gap is formed between the word line structure and the bit line structure, the read and write interference may also be reduced. At the same time, the plurality of groups of the stacked pillar-shaped conductive structures and cup-shaped conductive structures may also be formed, the stability of the semiconductor structure is guaranteed while the depth-to-width ratio of the semiconductor structure is increased.

Figure 18:
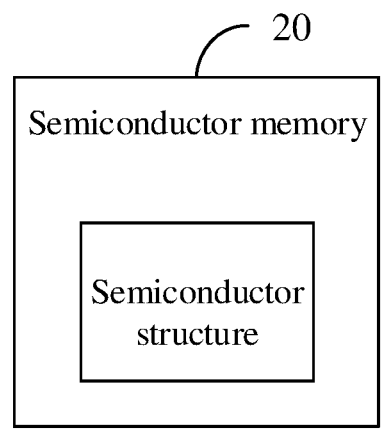
FIG. 18 is a schematic diagram of composition structure of a semiconductor memory provided by an embodiment of the disclosure.

In another embodiment of the disclosure, referring to FIG. 18, it shows a composition structure schematic diagram of a semiconductor memory provided by an embodiment of the disclosure. As shown in FIG. 18, the semiconductor memory 20 may include the semiconductor structure in any one of the previous embodiments.

In some embodiments, the semiconductor memory 20 may be a DRAM.

Further, in a specific example, the semiconductor structure may be a capacitor structure, and may also be referred to as a DRAM capacitor structure. In this way, for the semiconductor memory 20, based on the semiconductor structure described in any one of the previous embodiments, the semiconductor memory 20 may increase the storage capacity of the capacitor while also improving the stability of the capacitor structure.

It should be noted that in the disclosure, terms "include", "contain" or any other variants thereof are intended to cover non-exclusive inclusion, so that a process, a method, an article or a device including a series of elements not only includes those elements, but also includes other elements that are not explicitly listed, or elements inherent to the process, the method, the article, or the device. In the case without more restrictions, an element defined by a sentence "including a . . . " does not exclude the existence of other same elements in the process, the method, the article, or the device that includes the element.

The serial numbers of the above embodiments of the disclosure are only for descriptions, and do not represent the superiority or inferiority of the embodiments.

The methods disclosed in the several method embodiments provided in the disclosure may be combined arbitrarily in the case without conflicting, as to obtain a new method embodiment.

The features disclosed in the several product embodiments provided in the disclosure may be combined arbitrarily in the case without conflicting, as to obtain a new product embodiment.

The features disclosed in the several method or device embodiments provided in the disclosure may be combined arbitrarily in the case without conflicting, as to obtain a new method embodiment or device embodiment.

What is claimed is:

1. A semiconductor structure, comprising:
   a substrate;
   a bit line structure, a plurality of active pillars, and a word line structure located above the substrate; wherein bottom ends of the active pillars are connected to the bit line structure, and the active pillars are connected with the word line structure;
   a pillar-shaped conductive structure, located above each active pillar of the active pillars;
   a cup-shaped conductive structure, located above the pillar-shaped conductive structure; wherein the cup-shaped conductive structure and the pillar-shaped conductive structure form a lower electrode of the semiconductor structure;
   a dielectric layer, located on a surface of the lower electrode; and
   an upper electrode, covering a surface of the dielectric layer and filling an electrode gap between adjacent pillar-shaped conductive structure and between adjacent cup-shaped conductive structure,
   wherein the upper electrode is opposite to an outer surface of the pillar-shaped conductive structure and an inner surface and an outer surface of the cup-shaped conductive structure, so as to form a capacitor structure.

2. The semiconductor structure of claim 1, wherein:
   the bit line structure is located on the substrate, and the bit line structure extends along a first direction;
   the active pillars and the word line structure are located on the bit line structure, and the word line structure extends along a second direction.

3. The semiconductor structure of claim 2, further comprising a first isolation structure and a bit line gap located in the first isolation structure; wherein the first isolation structure and the bit line structure are formed in a same plane.

4. The semiconductor structure of claim 3, further comprising a second isolation structure, and the second isolation structure is located above the bit line structure and the first isolation structure; wherein the word line structure is located above the second isolation structure, and there is a word line gap between word line structures.

5. The semiconductor structure of claim 4, further comprising a third isolation structure; wherein the third isolation structure is located above the word line structure, and a top surface of the third isolation structure and a top surface of the active pillars are located in a same plane.

6. The semiconductor structure of claim 5, further comprising a gate oxide layer; wherein the gate oxide layer covers a pillar side surface of the active pillars.

7. The semiconductor structure of claim 1, further comprising: a first support layer located on the active pillars, a second support layer located on top of the pillar-shaped conductive structure, and a third support layer located on top of the cup-shaped conductive structure.

8. The semiconductor structure of claim 7, wherein a size of a cross section of the cup-shaped conductive structure perpendicular to the extension direction of the cup-shaped conductive structure is greater than a size of a cross section of the pillar-shaped conductive structure perpendicular to the extension direction of the pillar-shaped conductive structure.

9. The semiconductor structure of claim 1, further comprising a plurality of groups of the pillar-shaped conductive structure and cup-shaped conductive structure which are stacked.

10. A semiconductor memory, comprising a semiconductor structure,
    wherein the semiconductor structure comprises:
    a substrate;
    a bit line structure, a plurality of active pillars, and a word line structure located above the substrate; wherein bottom ends of the active pillars are connected to the bit line structure, and the active pillars are connected with the word line structure;
    a pillar-shaped conductive structure, located above each active pillar of the active pillars;
    a cup-shaped conductive structure, located above the pillar-shaped conductive structure; wherein the cup-shaped conductive structure and the pillar-shaped conductive structure form a lower electrode of the semiconductor structure;
    a dielectric layer, located on a surface of the lower electrode; and
    an upper electrode, covering a surface of the dielectric layer and filling an electrode gap between adjacent pillar-shaped conductive structure and between adjacent cup-shaped conductive structure,
    wherein the upper electrode is opposite to an outer surface of the pillar-shaped conductive structure and an inner surface and an outer surface of the cup-shaped conductive structure, so as to form a capacitor structure.

* * * * *